United States Patent [19]

Kurafuji

[11] Patent Number: 4,539,494
[45] Date of Patent: Sep. 3, 1985

[54] SEMICONDUCTOR DEVICE FOR USE IN A SENSE AMPLIFIER

[75] Inventor: Setsuo Kurafuji, Kawasaki, Japan

[73] Assignee: Fujitsu Limited, Kawasaki, Japan

[21] Appl. No.: 478,725

[22] Filed: Mar. 25, 1983

[30] Foreign Application Priority Data

Mar. 30, 1982 [JP] Japan .................................. 57-50089

[51] Int. Cl.³ ..................... H03K 5/24; G01R 19/165; G11C 7/06
[52] U.S. Cl. .................................. 307/530; 307/362; 365/190; 365/208
[58] Field of Search ............... 307/491, 497, 362, 530, 307/475; 365/190, 207, 208

[56] References Cited

U.S. PATENT DOCUMENTS

| 4,004,164 | 1/1977 | Cranford, Jr. et al. | 307/362 X |
| 4,223,394 | 9/1980 | Pathak et al. | 307/530 X |
| 4,287,570 | 9/1981 | Stark | 307/530 X |
| 4,375,039 | 2/1983 | Yamauchi | 307/530 |
| 4,412,143 | 10/1983 | Patella et al. | 307/530 |

OTHER PUBLICATIONS

De Simone et al., "MOSFET Sense Amplifier with Low-Input Impedance", *IBM Tech. Discl. Bull.*, vol. 14, No. 8, pp. 2290–2291, 1/1972.

*Primary Examiner*—Larry N. Anagnos
*Attorney, Agent, or Firm*—Staas & Halsey

[57] ABSTRACT

A semiconductor device for use in a sense amplifier of a memory circuit includes a first load, a second load, third loads and first and second enhancement-type transistors. The first enhancement-type transistor is connected between the first load and the third loads and receives a data signal. The second enhancement-type transistor is connected between the second load and the third loads and receives a reference voltage. The reference voltage is compensated for by a temperature-compensating circuit so that the reference voltage is changed in accordance with a change in temperature.

9 Claims, 5 Drawing Figures

SEMICONDUCTOR DEVICE FOR USE IN A SENSE AMPLIFIER

BACKGROUND OF THE INVENTION

1. Field of the Invention

The present invention relates to a semiconductor device for use in a sense amplifier of a memory circuit. Particularly, it relates to a differential amplifier for amplifying the difference in potential between a data signal and a reference voltage.

2. Description of the Prior Art

Generally, in a metal-oxide semiconductor (MOS) static memory circuit, a sense amplifier and an output buffer are provided at the output portion thereof. The sense amplifier usually consists of one or more stages of differential amplifiers, including a differential amplifier for amplifying the difference in potential between a data signal and a reference voltage.

The conductance $g_m$ of an MOS transistor decreases as the temperature increases. Therefore, a high level, i.e., an on-output level, of the output buffer, obtained from an output of the differential amplifier, has a negative temperature coefficient. A change in the on-output level of the output buffer creates a serious problem in a circuit such as an emitter-coupled logic (ECL) circuit.

SUMMARY OF THE INVENTION

It is an object of the present invention to provide a semiconductor device for use in a sense amplifier in which a reference voltage is changed in accordance with a change in the temperature of the device, thereby stabilizing the on-output level of an output buffer.

The above-mentioned object can be achieved, according to the present invention, by a sense amplifier circuit which includes first, second and third loads, and first and second enhancement-type transistors. The first enhancement-type transistor is connected between the first and the third loads and receives a data signal. The second enhancement-type transistor is connected between the second and the third loads and receives a reference voltage. The reference voltage is compensated for by a temperature-type compensating circuit so that the reference voltage is changed in accordance with a change in temperature.

BRIEF DESCRIPTION OF THE DRAWINGS

The present invention will be more clearly understood from the following description made with reference to the accompanying drawings wherein.

DESCRIPTION OF THE PREFERRED EMBODIMENTS

Figure 1:
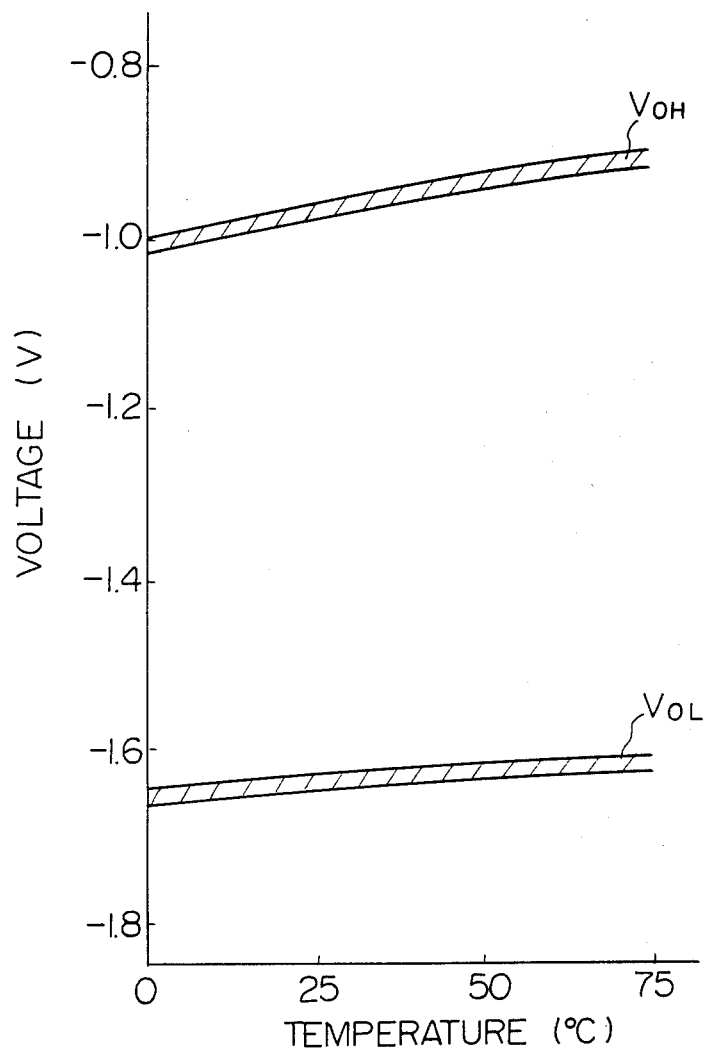
FIG. 1 is a graph illustrating an example of the margin between ECL levels.

As is illustrated in FIG. 1, in an ECL circuit, two levels, i.e., a high level $V_{OH}$ and a low level $V_{OL}$, are used. The low level $V_{OL}$ increases slightly as the temperature increases. On the other hand, the high level $V_{OH}$ increases greatly as the temperature increases. The semiconductor device according to the present invention is used for generating signals for an ECL circuit having bi-level signals, as is shown in FIG. 1.

Figure 2:
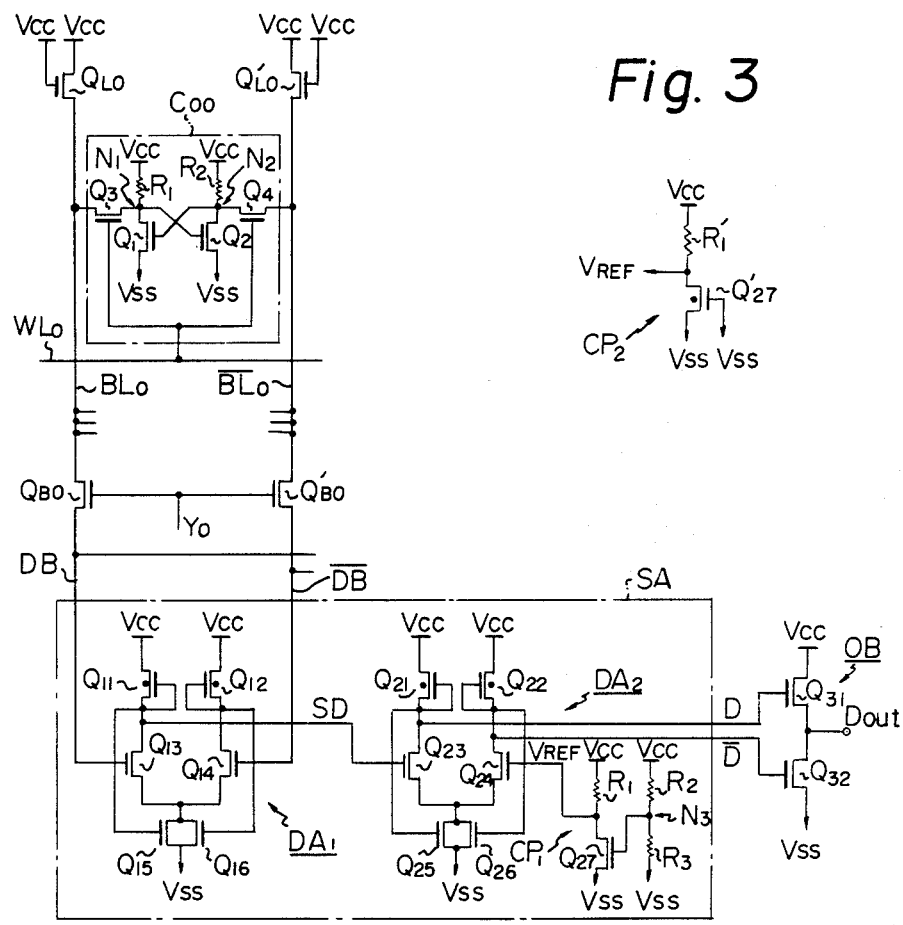
FIG. 2 is a circuit diagram illustrating an embodiment of the semiconductor device according to the present invention.

In FIG. 2, which illustrates an embodiment of the present invention, $C_{OO}$ designates a memory cell, $WL_O$ designates a word line, $BL_O$ and $\overline{BL_O}$ designate bit lines, $Q_{LO}$ and $Q'_{LO}$ designate load transistors, $Q_{BO}$ and $Q'_{BO}$ designate column selection transistors selected by a column selection signal $Y_O$, DB and $\overline{DB}$ designate data bit or bus lines, SA designates a sense amplifier, and OB designates an output buffer.

$V_{cc}$ designates a first power supply and its potential and $V_{ss}$ designates a second power supply and its potential. For an ECL level circuit, $V_{cc}$ is the ground level and $V_{ss}$ is $-5.2$ volts while for a transistor-transistor logic level, $V_{cc}$ is $+5$ volts and $V_{ss}$ is the ground level.

The memory cell $C_{OO}$ comprises resistors $R_1$ and $R_2$, cross-coupled driver transistors $Q_1$ and $Q_2$, and transfer transistors $Q_3$ and $Q_4$.

The sense amplifier SA comprises a first differential amplifier $DA_1$, a second differential amplifier $DA_2$, and a temperature-compensating circuit $CP_1$. The first differential amplifier $DA_1$ comprises depletion-type load transistors $Q_{11}$ and $Q_{12}$ connected to the power supply $V_{cc}$, enhancement-type input transistors $Q_{13}$ and $Q_{14}$ for receiving the data signals of the data bit lines DB and $\overline{DB}$, and enhancement-type load transistors $Q_{15}$ and $Q_{16}$ connected between the input transistors $Q_{13}$ and $Q_{14}$ and the power supply $V_{ss}$. The second differential amplifier $DA_2$ has the same configuration as the first differential amplifier $DA_1$. That is, the elements $Q_{21}$ through $Q_{26}$ of the second differential amplifier $DA_2$ correspond to the elements $Q_{11}$ through $Q_{16}$ of the first differential amplifier $DA_1$. The first differential amplifier $DA_1$ detects and amplifies the difference in potential between the data bit lines DB and $\overline{DB}$, while the second differential amplifier $DA_2$ detects and amplifies the difference in potential between an output SD of the first differential amplifier $DA_1$ and a reference voltage $V_{REF}$ to transmit its outputs D and $\overline{D}$ to the output buffer OB.

The reference voltage $V_{REF}$ is changed by the temperature-compensating circuit $CP_1$, which comprises resistors $R_1$, $R_2$ and $R_3$, and an enhancement-type transistor $Q_{27}$.

The circuit of FIG. 2 is operated by making the potential at the word line $WL_O$ high so as to turn on the transfer transistors $Q_3$ and $Q_4$ and by simultaneously or subsequently making the column selection signal $Y_O$ high so as to turn on the transistors $Q_{BO}$ and $Q'_{BO}$. In this state, if the transistors $Q_1$ and $Q_2$ are in an on state and in an off state, respectively, the potential at the node $N_1$ is low and the potential at the node $N_2$ is high, and, accordingly, the potential at the bit line $BL_O$ is low and the potential at the bit line $\overline{BL_O}$ is high. In addition, the potential at the data bit line DB is low and the potential at the data bit line $\overline{DB}$ is high. The difference in potential between the data bit lines DB and $\overline{DB}$ is detected and amplified by the first differential amplifier $DA_1$.

Next, the difference in potential between the output SD of the first differential amplifier $DA_1$ and the reference voltage $V_{REF}$ is detected and amplified by the second differential amplifier $DA_2$, whose outputs D and $\overline{D}$ are transmitted to the gates of the transistors $Q_{31}$ and $Q_{32}$ of the output buffer OB, respectively. Therefore, if the potential of the output D is low and the potential of the output $\overline{D}$ is high, the potential of the output $D_{OUT}$ is low. This low potential is referred to as $V_{OL}$. Contrary to this, if the potential of the output D is high and the potential of the output $\overline{D}$ is low, the potential of the output $D_{OUT}$ is high. This high potential is referred to as $V_{OH}$. In this case, the low potential $V_{OL}$ and the high potential $V_{OH}$ of the output $D_{OUT}$ are determined by the ratio of the conductance $g_m$ of the transistor $Q_{31}$ to that of the transistor $Q_{32}$.

Therefore, even if the high potential of the output D and the low potential of the output $\overline{D}$ are definite, when the temperature increases, the high potential $V_{OH}$ of the output $D_{OUT}$ decreases. This is because the conductance $g_m$ of each of the transistors $Q_{31}$ and $Q_{32}$ decreases as the temperature increases. Thus, the reduced high potential $V_{OH}$ creates a disadvantage in an ECL circuit which has the characteristics shown in FIG. 1.

According to the present invention, the above-mentioned disadvantage is eliminated since the reference voltage $V_{REF}$ is increased by the temperature-compensating circuit $CP_1$ as the temperature increases.

Figure 4:
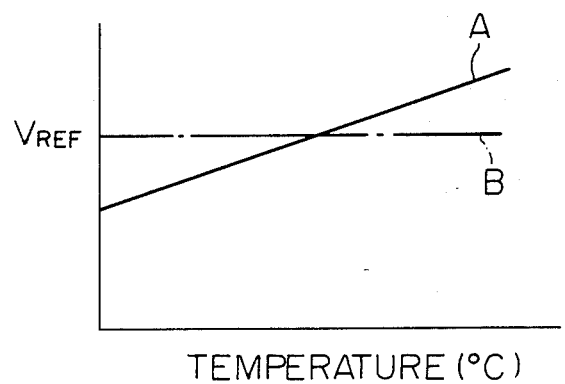
FIG. 4 is a graph illustrating the characteristics of the reference voltage $V_{REF}$ of FIG. 2 and FIG. 3.

The temperature-compensating circuit $CP_1$ will now be explained in more detail. Since the potential at the node $N_3$ between the resistors $R_2$ and $R_3$ is almost constant regardless of the temperature, the gate potential of the transistor $Q_{27}$ is also almost constant. In the transistor $Q_{27}$, when the temperature increases, the conductance $g_m$ of the transistor $Q_{27}$ decreases so as to increase the saturation voltage between the drain and source of the transistor $Q_{27}$, i.e., the reference voltage $V_{REF}$ indicated by the line A in FIG. 4. The line B in FIG. 4 indicates the reference voltage $V_{REF}$ of the prior art.

Therefore, in the second differential amplifier $DA_2$, the difference in potential between the output SD and the reference voltage $V_{REF}$ increases as the temperature increases. As a result, the high potential of the output D becomes high and the low potential of the output $\overline{D}$ becomes low. Therefore, in the output buffer OB, the transistor $Q_{31}$ is fully controlled in the on direction while the transistor $Q_{32}$ is fully controlled in the off direction.

Figure 5:
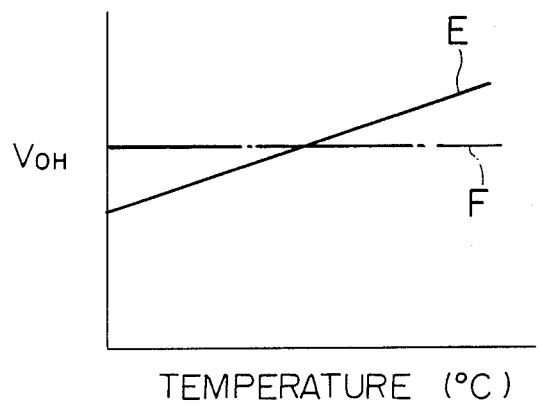
FIG. 5 is a graph illustrating the characteristics of the on-output $V_{OH}$ of FIG. 2.

Thus, the decrease in the conductance $g_m$ of the transistor $Q_{31}$ due to the increase in temperature is compensated for by the increase in the gate potential applied to the transistor $Q_{31}$. Accordingly, the high potential $V_{OH}$ of the output $D_{OUT}$ never decreases and has a positive temperature coefficient, as is shown by the line E in FIG. 5. The line F in FIG. 5 shows the temperature coefficient of the prior art.

Figure 3:
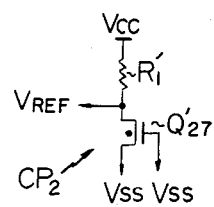
FIG. 3 is a circuit diagram illustrating another embodiment of the semiconductor device according to the present invention.

In FIG. 3, which illustrates another embodiment of the present invention, a temperature-compensating circuit $CP_2$, comprising a resistor $R'_1$ and a depletion-type transistor $Q'_{27}$, is used as the temperature-compensating circuit $CP_1$ of FIG. 2. This depletion-type transistor $Q'_{27}$ is manufactured by the same process as the transistors $Q_{11}$, $Q_{12}$, $Q_{21}$, and $Q_{22}$.

A change in the reference voltage $V_{REF}$ of the temperature-compensating circuit $CP_2$ due to a change in temperature is made in the same as that of the temperature-compensating circuit $CP_1$. In addition to temperature compensation, the embodiment of FIG. 3 has an advantage in that fluctuation of the conductance $g_m$ of each of the depletion-type transistors $Q_{21}$ and $Q_{22}$ is compensated for. That is, if the conductance $g_m$ of each of the transistors $Q_{21}$ and $Q_{22}$ decreases due to fluctuations in the manufacturing process, the high potential of the output D decreases. As a result, the high potential $V_{OH}$ of the output $D_{OUT}$ decreases and the low potential $V_{OL}$ of the output $D_{OUT}$ increases. However, in this embodiment, the conductance $g_m$ of the transistor $Q'_{27}$ also decreases so as to increase the reference voltage $V_{REF}$. As a result, the high potential of the output D becomes high and the low potential of the output $\overline{D}$ becomes low. Thus, fluctuation of the conductance $g_m$ of the transistors $Q_{21}$ and $Q_{22}$ due to the manufacturing process is compensated.

Note that the characteristics of a depletion-type transistor are greatly dependent upon the process for ion-implanting impurities in a channel area of an enhancement-type transistor to change the transistor from an enhancement-type transistor to a depletion-type transistor. As was explained above, in the embodiment of FIG. 3, the depletion-type transistor $Q'_{27}$, which is manufactured by the same process as the transistors $Q_{21}$ and $Q_{22}$, enables the fluctuation of the manufacturing process to be compensated.

As explained hereinbefore, according to the present invention, the reference voltage $V_{REF}$ of the differential amplifier $DA_2$ increases as the temperature increases. As a result, the difference between the high potential of the output D and the low potential of the output $\overline{D}$ of the differential amplifier $DA_2$ can be increased, and, accordingly, when the outputs D and $\overline{D}$ are used in the output buffer OB, the high potential $V_{OH}$ of the output $D_{OUT}$ is never decreased.

I claim:

1. A semiconductor device for amplifying a difference in potential between a storage state of a memory cell and a reference voltage, comprising:

first power supply means for providing a first potential;

second power supply means for providing a second potential, lower than said first potential;

first amplifying means, operatively connected to the memory cell, for sensing the storage state of the memory cell and for generating a data signal with a temperature dependency;

second amplifying means for producing an output signal in dependence upon the data signal and the reference voltage, comprising:

first and second load means, operatively connected to said first power supply means, for providing loads;

a first enhancement-type MIS transistor having a drain operatively connected to said first load means, a gate operatively connected to said first amplifying means to receive the data signal and a source;

a second enhancement-type MIS transistor having a drain operatively connected to said second load means, a gate for receiving the reference voltage and a source; and third load means, operatively connected between the sources of said first and second enhancement-type MIS transistors and to said second power supply means, for providing a load; and a temperature-compensating circuit, operatively connected to said first and second power supply means and the gate of said second enhancement-type MIS transistor, for generating the reference voltage and providing temperature compensation by changing the reference voltage in accordance with changes in temperature to provide the reference voltage with a temperature dependency which is different from the temperature dependency of the data signal; and output buffer means, operatively connected to said first and second load means, for buffering the output signal to produce a buffered output signal having a level, said temperature compensating circuit compensating for changes in the level of the buffered output signal caused by the changes in temperature.

2. A semiconductor device as set forth in claim 1, wherein each of said first and second load means comprises a depletion-type transistor having a drain operatively connected to said first power supply means and a commonly connected gate and source operatively connected to the drain of said first and second enhancement-type MIS transistors, respectively.

3. A semiconductor device as set forth in claim 1, wherein said output buffer means comprises:
  a third enhancement-type MIS transistor having a drain operatively connected to said first power supply means, a gate operatively connected to said first load means, and a source for providing the buffered output signal; and
  a fourth enhancement-type MIS transistor having a drain operatively connected to the source of said third enhancement-type transistor, a gate operatively connected to said second load means, and a source operatively connected to said second power supply means.

4. A semiconductor device for amplifying a difference in potential between a data signal read out of a memory cell and a reference voltage, comprising:
  first power supply means for providing a first potential;
  second power supply means for providing a second potential, lower than the first potential;
  first and second load means, operatively connected to said first power supply means, for providing loads;
  a first enhancement-type MIS transistor having a drain operatively connected to said first load means, a gate for receiving said data signal and a source;
  a second enhancement-type MIS transistor having a drain operatively connected to said second load means, a gate for receiving the reference voltage and a source;
  third load means for providing a load, comprising third and fourth enhancement-type MIS transistors connected in parallel, each having a drain operatively connected to the sources of said first and second enhancement-type MIS transistors, respectively, a gate operatively connected to said first and second load means, respectively, and a source operatively connected to said second power supply means; and
  a temperature-compensating circuit, operatively connected to said first and second power supply means and the gate of said second enhancement-type MIS transistor, for generating the reference voltage and changing the reference voltage in accordance with a change in temperature.

5. A semiconductor device for amplifying a difference in potential between a data signal read out of a memory cell and a reference voltage, comprising:
  first power supply means for providing a first potential;
  second power supply means for providing a second potential, lower than the first potential;
  first and second load means, operatively connected to said first power supply means, for providing loads;
  a first enhancement-type MIS transistor having a drain operatively connected to said first load means, a gate for receiving said data signal and a source;
  a second enhancement-type MIS transistor having a drain operatively connected to said second load means, a gate for receiving the reference voltage and a source;
  third load means, operatively connected between the sources of said first and second enhancement-type MIS transistors and to said second power supply means, for providing a load; and
  a temperature compensating circuit, comprising:
    a first resistor operatively connected to said first power supply means;
    a compensating enhancement-type MIS transistor having a drain operatively connected to said first resistor and the gate of said second enhancement-type MIS transistor, a gate, and a source operatively connected to said second power supply means; and
    second and third resistors, operatively connected to said first and second power supply means and the gate of said compensating enhancement-type MIS transistor, for applying a constant voltage to the gate of said compensating enhancement-type MIS transistor.

6. A semiconductor device for amplifying a difference in potential between a data signal read out of a memory cell and a reference voltage, comprising:
  first power supply means for providing a first potential;
  second power supply means for providing a second potential, lower than the first potential;
  first and second load means, operatively connected to said first power supply means, for providing loads;
  a first enhancement-type MIS transistor having a drain operatively connected to said first load means, a gate for receiving said data signal and a source;
  a second enhancement-type MIS transistor having a drain operatively connected to said second load means, a gate for receiving the reference voltage and a source;
  third load means, operatively connected between the sources of said first and second enhancement-type MIS transistors and to said second power supply means, for providing a load; and
  a temperature-compensating circuit, comprising:
    a resistor operatively connected to said first power supply means; and
    a depletion-type transistor having a drain operatively connected to said resistor and the gate of said second enhancement-type MIS transistor, and a gate and a source operatively connected to said second power supply means.

7. A semiconductor device, comprising:
  a memory cell for storing data, said memory cell providing a data signal containing the contents of the data stored in said memory cell;
  an output buffer having a negative temperature coefficient; and
  sense amplifier means, operatively connected between said memory cell and said output buffer, for amplifying said data signal, and comprising compensating means for compensating the negative temperature coefficient of said output buffer.

8. A semiconductor device, comprising:

a memory cell for storing data, said memory cell providing a data signal containing the contents of the data stored in said memory cell;

an output buffer having a negative temperature coefficient; and sense amplifier means for amplifying the data signal, comprising:

first differential amplifier means, operatively connected to said memory cell, for amplifying said data signal;

second differential amplifier means, operatively connected to said first differential amplifier means and said output buffer, for providing an output data signal and an inverse output data signal from the data signal amplified by said first differential amplifier means; and compensating means for compensating the negative temperature coefficient of said output buffer, comprising:

first power supply means for providing a first potential;

second power supply means for providing a second potential, lower than said first potential;

a first resistor operatively connected to said first power supply means;

an enhancement-type MIS transistor, operatively connected to said first resistor, said second differential amplifier means and said second power supply means, having a gate; and second and third resistors, operatively connected to said first and second power supply means, respectively, and operatively connected to each other and to the gate of said enhancement-type MIS transistor, for applying a constant voltage to the gate of said enhancement-type MIS transistor.

9. A semiconductor device, comprising:

a memory cell for storing data, said memory cell providing a data signal containing the contents of the data stored in said memory cell;

an output buffer having a negative temperature coefficient; and sense amplifier means for amplifying the data signal, comprising:

first differential amplifier means, operatively connected to said memory cell, for amplifying said data signal;

second differential amplifier means, operatively connected to said first differential amplifier means and said output buffer, for providing an output data signal and an inverse output data signal from said data signal amplified by said first differential amplifier means; and compensating means for compensating the negative temperature coefficient of said output buffer, comprising:

first power supply means for providing a first potential;

second power supply means for providing a second potential, lower than said first potential;

a resistor operatively connected to said first power supply means; and a depletion-type transistor operatively connected to said resistor, said second differential amplifier means and said second power supply means.

* * * * *